US010459018B2

(12) United States Patent
Arsenovic (10) Patent No.: US 10,459,018 B2
(45) Date of Patent: Oct. 29, 2019

(54) METHOD TO REMOVE THE EFFECTS OF LO DRIFT FROM VECTOR NETWORK ANALYZER MEASUREMENTS

(71) Applicant: Eight Ten Labs LLC, Stanardsville, VA (US)

(72) Inventor: Alex Arsenovic, Stanardsville, VA (US)

( * ) Notice: Subject to any disclaimer, the term of this patent is extended or adjusted under 35 U.S.C. 154(b) by 318 days.

(21) Appl. No.: 15/585,220

(22) Filed: May 3, 2017

(65) Prior Publication Data

US 2017/0324375 A1 Nov. 9, 2017

Related U.S. Application Data

(60) Provisional application No. 62/332,550, filed on May 6, 2016.

(51) Int. Cl.
*G01R 27/28* (2006.01)
(52) U.S. Cl.
CPC ................... *G01R 27/28* (2013.01)

(58) Field of Classification Search
CPC ...................................................... G01R 27/28
See application file for complete search history.

(56) References Cited

U.S. PATENT DOCUMENTS 6,636,816 B1 * 10/2003 Dvorak ................. G01R 27/28
 324/76.41
7,058,377 B1 * 6/2006 Mitsdarffer .............. H04B 1/28
 455/209

* cited by examiner

*Primary Examiner* — Jeffrey M Shin
(74) *Attorney, Agent, or Firm* — Dale Jensen, PLC; Dale Jensen (57) ABSTRACT

Certain exemplary embodiments can provide a method, which can comprise automatically removing effects of local oscillator phase drift occurring in between two measurements of reciprocal networks as made with a vector network analyzer. The method can further comprise determining that the vector network analyzer substantially simultaneously samples all incident and reflected waves from the reciprocal networks.

9 Claims, 4 Drawing Sheets

METHOD TO REMOVE THE EFFECTS OF LO DRIFT FROM VECTOR NETWORK ANALYZER MEASUREMENTS

CROSS-REFERENCES TO RELATED APPLICATIONS

This application claims priority to, and incorporates by reference herein in its entirety, U.S. Provisional Patent Application Ser. No. 62/332,550, filed May 6, 2016.

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DETAILED DESCRIPTION

Certain exemplary embodiments can provide a method, which can comprise automatically removing effects of local oscillator phase drift occurring in between two measurements of reciprocal networks as made with a vector network analyzer. The method can further comprise determining that the vector network analyzer substantially simultaneously samples all incident and reflected waves from the reciprocal networks.

A two-port scattering parameter measurement of a reciprocal device is made using a vector network analyzer ("VNA"), with or without a frequency extender ("FE"). This measurement is made using either all four receivers or has been corrected for switch terms. The measurement error introduced by changing phase differences in the VNA's, or FE's local oscillator ("LO") electrical paths are removed using information from a pair of transmissive measurements.

Certain exemplary embodiments are generally related to the processing of measurement data from VNA's to compensate for the error introduced by LO phase drift.

Figure 1:
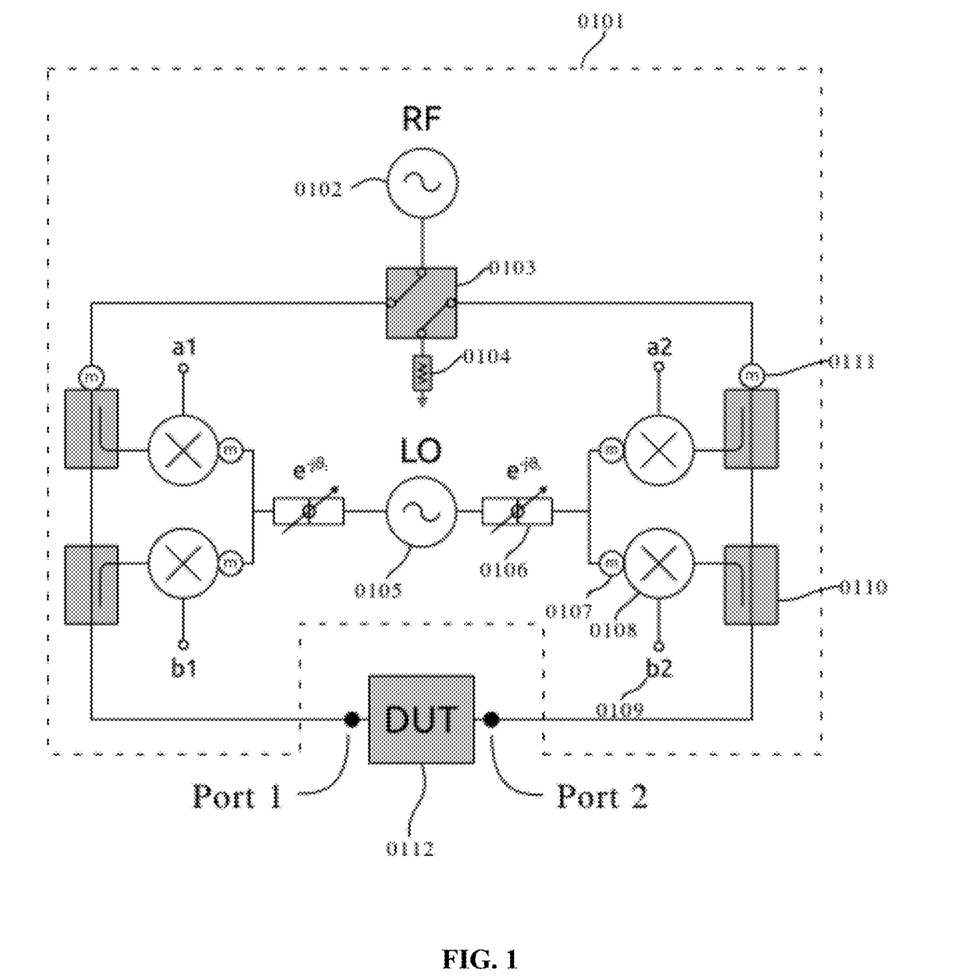
FIG. 1 is a circuit diagram for a vector network analyzer that has been simplified to highlight components relevant to this specification.

VNAs are used to characterize devices at radio frequencies and above. The basic architecture of a VNA is shown in FIG. 1, which is prior art. The additional use of FE units can add additional sets of multipliers, mixers and couplers, but the relevant architecture remains similar to FIG. 1. Given the model for a VNA shown in FIG. 1, intermediate frequencies ("IFs") are related to LO and radio frequencies ("RF") by a basic mixer identity:

$$\cos(M(\omega_{lo} - \theta))\cos(\omega_{rf}) = \frac{1}{2}\cos(M(\omega_{lo} - \theta - \omega_{rf})) + \frac{1}{2}\cos(M(\omega_{lo} - \theta + \omega_{rf})). \quad (1)$$

Where $\theta$ is a phase offset in the LO cable, and M is the multiplication factor of the frequencies multipliers, if present. A $\theta$ change in LO cable phase will result in a M$\theta$ change in IF phase. The S-parameters are defined as the vector ratios of the IF signals:

$$s_{mn} = \frac{b_m}{a_n}. \quad (2)$$

Because the S-parameters are ratio measurements, the absolute phase of the LO is irrelevant. However, if two LO path lengths, $\theta_1$ and $\theta_2$, are independently altered in between two transmissive measurements, an inconsistency is introduced into the mathematical model. If the LO path for port 1 is altered by $e^{-j\theta_1}$ and port 2 by $e^{-j\theta_2}$, the resultant S-parameters will be:

$$s'_{mn} = \frac{e^{-jM\theta_m} b_m}{e^{-jM\theta_n} a_n} = e^{-jM(\theta_m - \theta_n)} s_{mn}. \quad (3)$$

For reflective S-parameters m=n and the difference in LO path length cancels out, but for the transmissive S-parameters it remains. This effect is known as LO cable drift. If we evaluate (3) for all four s-parameters and consolidate the net phase contributions into a single variable $\theta$, we get the following representation of a drifted S-matrix:

$$S' = \begin{pmatrix} s_{11} & s_{12} e^{-j\theta} \\ s_{21} e^{j\theta} & s_{22} \end{pmatrix}. \quad (4)$$

Thus, the LO drift is shown to be an anti-reciprocal perturbation. A method to quantify and remove the LO drift is described herein.

The technique described, can be presented in the context of an error-box measurement model. The error-box measurement model assumes that the VNA and device under test may be modeled as a two-port A is embedded in the networks X and Y, producing an observable measurement $A_m$. If one chooses to represent the networks using wave-cascading matrices (a.k.a. T-matrices), this model can be expressed mathematically by:

$$A_m = XAY \quad (5).$$

Where matrix multiplication is implied by two adjacent symbols. To know how this model is affected by LO drift, the effect of LO drift on a network's T-parameters is determined. The T-matrix is defined in terms of the S-parameters as such:

$$T = \frac{1}{s_{21}} \begin{pmatrix} -\Delta s & s_{11} \\ -s_{22} & 1 \end{pmatrix}. \quad (6)$$

Therefore, the corresponding T-matrix for the drifted S-matrix is:

$$T = \frac{1}{s_{21} e^{j\theta}} \begin{pmatrix} -\Delta s & s_{11} \\ -s_{22} & 1 \end{pmatrix}. \quad (7)$$

Where $\Delta s$ represents the determinant of the s-matrix. Note that the determinant parameter $\Delta s$ is unaffected by this type of perturbation because the phase terms cancel:

$$\Delta s' = s_{11}s_{22} - s_{12}e^{j\theta}s_{21}e^{-j\theta} = \Delta s \qquad (8)$$

Equation (7) shows that LO drift introduces a multiplicative phase term into the network's T-matrix.

A technique to remove the LO-drift occurring between the measurements of two transmissive reciprocal devices is now described. This process, which we refer to as undrifting, is possible because LO-drift perturbs the measurements in a very specific (anti-reciprocal) way that is not consistent with the measurement model. Knowledge of the measurement model, combined with fact that the devices are reciprocal, provides enough information to quantify and remove the effect of LO drift.

Figure 2:
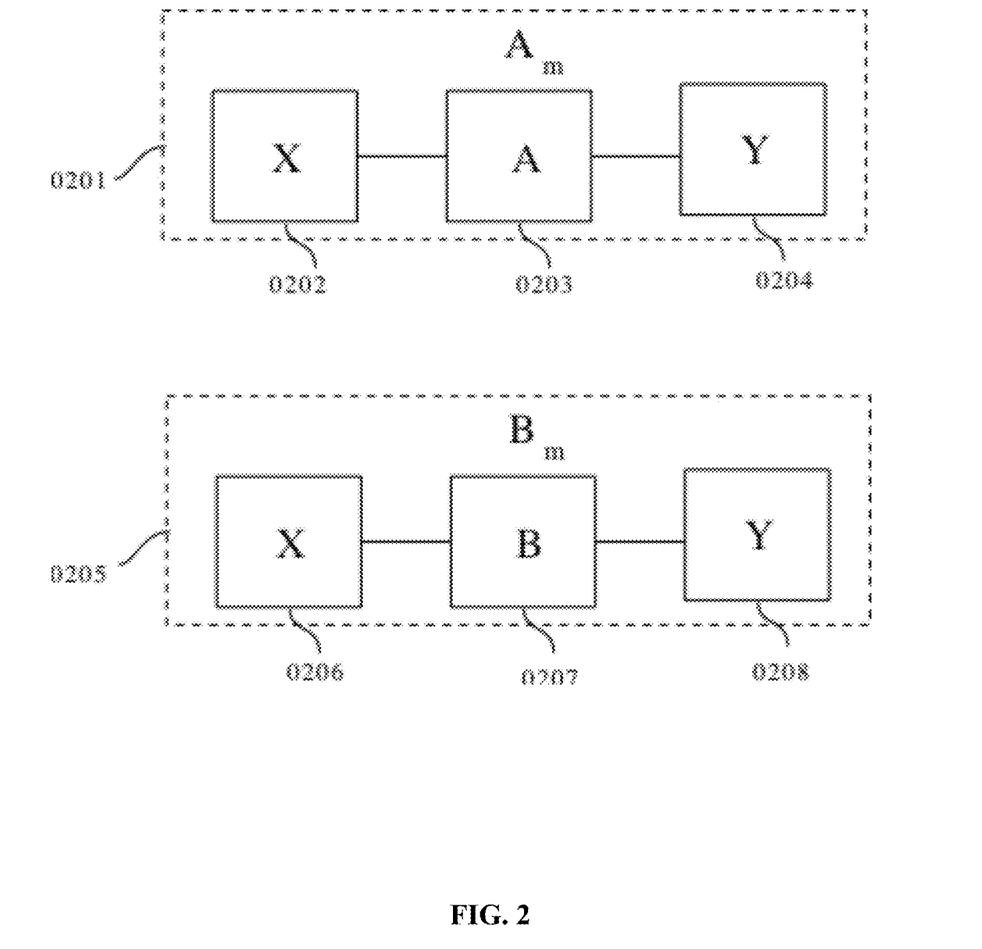
FIG. 2 is an error-box measurement model, which is constructed for the measurement of two transmissive networks.

Given two networks A and B embedded in the networks X and Y as shown in FIG. 2, we have the associated measurements $A_m$ and $B_m$ given by:

$$A_m = XAY$$

$$B_m = XBY \qquad (9).$$

From this we construct the following intermediary networks C and $C_m$:

$$A_m^{-1}B_m = Y^{-1}A^{-1}BY$$

$$C_m = Y^{-1}CY \qquad (10).$$

Where $C = A^{-1}B$, and $C_m = A_m^{-1}B_m$. This relation means that C and $C_m$, are similar matrices, related by the basis transformation Y. Similar matrices share several properties, one being their determinants (i.e., $|C_m|=|C|$). In the following we use vertical brackets to denote the determinant of a T-matrix. Further use of the properties of determinants allows us to write:

$$|C_m|=|C|$$

$$|A_m^{-1}B_m|=|A^{-1}B|$$

$$|A_m^{-1}||B_m|=|A^{-1}||B| \qquad (11).$$

The determinant of a T-matrix is equal to the complex ratio of the transmissive s-parameters:

$$|T| = \frac{s_{12}}{s_{21}}. \qquad (12)$$

Thus, if A and B are reciprocal, $|A|=|B|=1$, and $|A^{-1}|=|B^{-1}|=1$. This implies that the right hand side of (11) is equal to 1. Also note that $|A^{-1}|=|A|^{-1}$:

$$|A_m^{-1}||B_m|=1 \qquad (13).$$

If LO drift has occurred in between the measurements of $A_m$ and $B_m$, the determinant $|B_m|$ will be change proportionally to the drift. Evaluating the drifted determinant $B_m$ according to (4) and (7):

$$|B'_m| = \frac{b_{12}^m e^{-j\theta}}{b_{21}^m e^{j\theta}} = e^{-2\theta j}|B_m|. \qquad (14)$$

Finally, inserting this into (13) allows for the determination of the drift angle:

$$|A_m|^{-1}|B_m| = 1 \qquad (15)$$

$$e^{2\theta j}|A_m|^{-1}|B'_m| = 1$$

$$|A_m^{-1}||B'_m| = e^{2\theta j}$$

$$\theta = \frac{-\sphericalangle |A_m|^{-1}|B'_m|}{2}.$$

Where [angle symbol] represents the complex argument. The quantity $|A_m^{-1}||B'_m|$ is observable, and therefore effects of LO-drift may be directly quantified from the measurements of two reciprocal devices as given by equation (15). Once measured, the drift can be removed from the s-parameter measurements, by altering the measured s-matrix with the following transformation:

$$S' \to S$$

$$\begin{pmatrix} s'_{11} & s'_{12} \\ s'_{21} & s'_{22} \end{pmatrix} \to \begin{pmatrix} s'_{11} & s'_{12}e^{j\theta} \\ s'_{21}e^{-j\theta} & s'_{22} \end{pmatrix}$$

Figure 3:
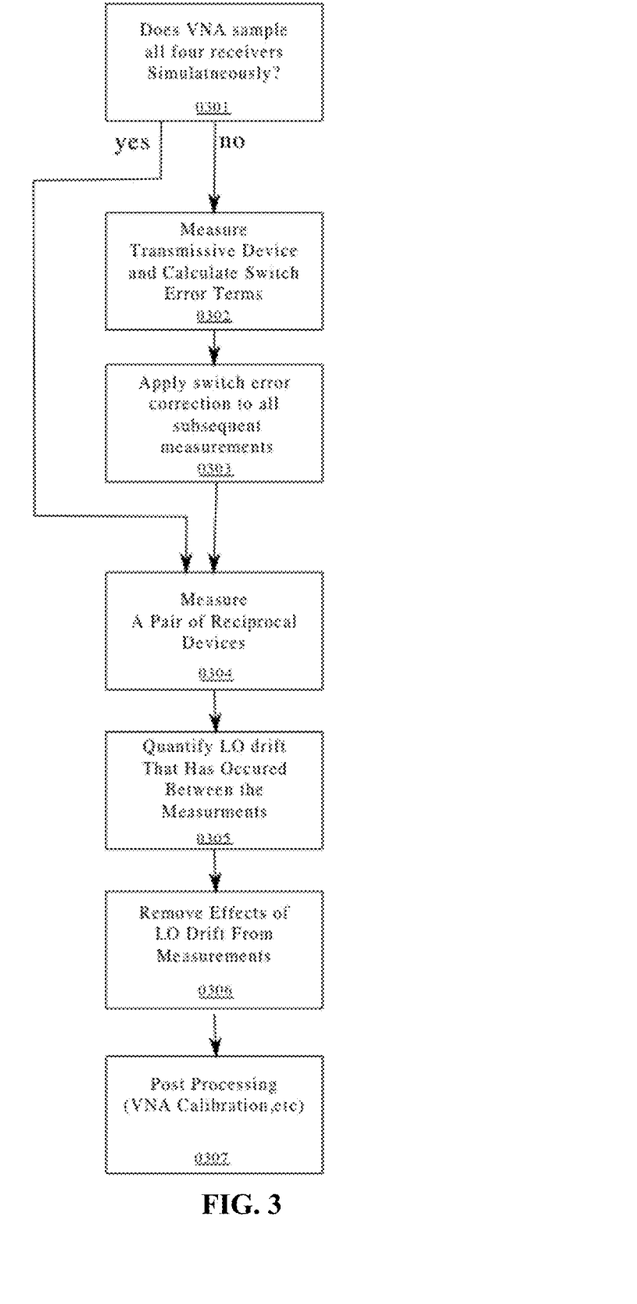
FIG. 3 is a flowchart of an exemplary embodiment of a method for removal of local oscillator ("LO") drift.

Because the analysis assumes the error-box model, the S-parameters must be measured in their full form (i.e., by sampling all incident and reflected waves). However, if only three receivers are sampled at a time, the resultant measurements must have their switch terms unterminated before the undrifting process. The two approaches can be generally equivalent. The flowchart for applying the undrifting method with and without unterminating is shown in FIG. 3. Once the measurements are undrifted, post processing such as VNA calibration can take place.

The angle relating two complex numbers is ambiguous as it passes through $\pm\pi$, known as a branch cut. Because the anti-reciprocity is twice the LO-drift angle, as expressed in (15), additional information is required choose the correct branch if the LO drift is larger than $\pm\pi/2$. If the LO-drift is slowly changing, then repeatedly measuring a network at a sufficiently fast rate, will allow the branch jumps in the complex argument to be detected and removed. Removal of such branch jumps is similar to well known phase unwrapping procedures. Alternatively, if the measurements are eventually corrected with a calibration, and both measured devices have a transmission phase that is known within $\pm\pi/2$ then the correct phase choice can be made easily.

FIG. 1 is a circuit diagram for a vector network analyzer that has been simplified to highlight components relevant to this specification.

FIG. 2 is an error-box measurement model, which is constructed for the measurement of two transmissive networks.

FIG. 3 is a flowchart of an exemplary embodiment of a method for removal of local oscillator ("LO") drift.

At activity 0301 a determination can be made as to whether a VNA samples receivers simultaneously. For example, a determination can be made that the VNA substantially simultaneously samples all incident and reflected waves from reciprocal networks.

At activity 0302, a transmissive device can be measured and/or switch error terms can be calculated. Certain exemplary embodiments can determine switch error terms of the vector network analyzer.

At activity 0303, switch error corrections can be applied to substantially all subsequent measurements. Certain exemplary embodiments can apply switch error term corrections to measurements.

At activity 0304, measurements can be made. For example, a response can be measured from each of the reciprocal networks with the vector network analyzer.

At activity 0305, LO drift that has occurred between measurements can be quantified. For example, local oscillator phase drift can be determined via a calculation of an equation:

$$\theta = \frac{-<|A_m|^{-1}|B'_m|}{2}$$

where:

$A_m$ are measurements of a first reciprocal network of the reciprocal networks; and $B_m$ are measurements of a second reciprocal network of the reciprocal networks.

At activity 0306, effects of local oscillator phase drift occurring in between two measurements of reciprocal networks as made with a vector network analyzer can be automatically removed. The effects of local oscillator phase drift can be removed from one or more transmissive standards during a calibration of the vector network analyzer.

Figure 4:
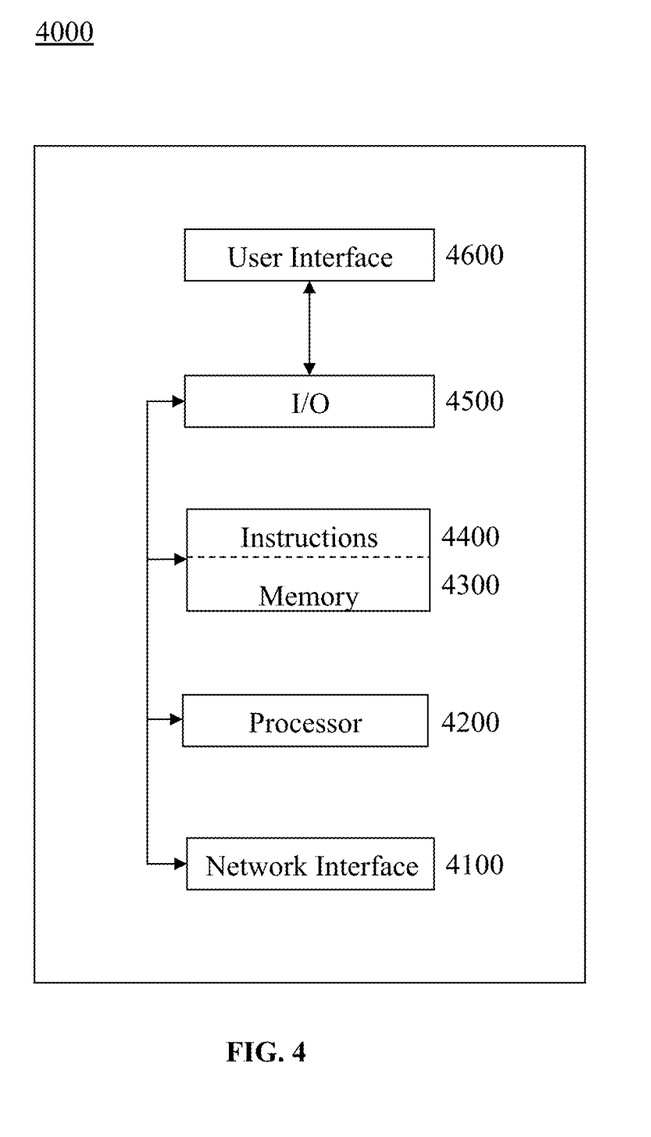
FIG. 4 is a block diagram of an exemplary embodiment of an information device 4000.

FIG. 4 is a block diagram of an exemplary embodiment of an information device 4000, which in certain operative embodiments can comprise an information device constructed to carry out one or more elements of the flowchart of FIG. 3. Information device 4000 can comprise any of numerous circuits and/or components, such as for example, one or more network interfaces 4100, one or more processors 4200, one or more memories 4300 containing instructions 4400, one or more input/output (I/O) devices 4500, and/or one or more user interfaces 4600 coupled to I/O device 4500, etc.

In certain exemplary embodiments, via one or more user interfaces 2600, such as a graphical user interface, a user can view a rendering of information related to local oscillator phase drift.

Definitions

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

a—at least one.

activity—an action, act, step, and/or process or portion thereof admittance—a measure of electrical conduction, numerically equal to the reciprocal of the impedance.

and/or—either in conjunction with or in alternative to.

apparatus—an appliance or device for a particular purpose associate—to join, connect together, and/or relate.

automatically—acting or operating in a manner essentially independent of external influence or control. For example, an automatic light switch can turn on upon "seeing" a person in its view, without the person manually operating the light switch.

calibrate—to compare measured values delivered by a system under test with those of a standard of known quantity and/or accuracy.

can—is capable of, in at least some embodiments.

capacitance—an ability of a system to store an electric charge.

cause—to produce an effect.

characteristic impedance—a ratio of the amplitudes of voltage and current of a single wave propagating along a transmission line; that is, a wave traveling in one direction in the absence of reflections in the other direction. Characteristic impedance is determined by the geometry and materials of the transmission line and, for a uniform line, is not dependent on its length.

circuit—an electrically conductive pathway and/or a communications connection established across two or more switching devices comprised by a network and between corresponding end systems connected to, but not comprised by the network.

comprising—including but not limited to.

conductance—a degree to which an object conducts electricity, calculated as a ratio of a current that flows to a potential difference present.

configure—to make suitable or fit for a specific use or situation.

constituent element—a component that is electrically coupled to a transmission line.

constructed to—made to and/or designed to.

convert—to transform, adapt, and/or change.

create—to bring into being.

cutoff frequency—a boundary in a system's frequency response at which energy flowing through the system begins to be reduced (attenuated or reflected) rather than passing through.

define—to establish the outline, form, or structure of determine—to obtain, calculate, decide, deduce, and/or ascertain.

device—a machine, manufacture, and/or collection thereof.

dielectric—a medium or substance that transmits electric force without conduction; an insulator.

distributed circuit parameters—attributes of an electrical network (e.g., resistance, capacitance, and inductance) that are distributed substantially continuously throughout the material of the circuit.

distributed impedance—a degree of opposition to electrical flow of alternating current, arising from the combined effects of ohmic resistance and reactance, which is substantially evenly distributed throughout a circuit.

distributed resistance—a degree of opposition to electrical flow which is substantially evenly distributed throughout a circuit.

effect—something that is produced by a cause.

estimate—to calculate and/or determine approximately and/or tentatively.

frequency response—a dependence on signal frequency of the output-input ratio of an amplifier or other device.

generate—to create, produce, give rise to, and/or bring into existence.

incident—directed so as to strike or propogate to something (e.g., as a wave).

inductance—a property of an electric conductor or circuit that causes an electromotive force to be generated by a change in the current flowing.

information device—any device capable of processing data and/or information, such as any general purpose and/or special purpose computer, such as a personal computer, workstation, server, minicomputer, mainframe, supercomputer, computer terminal, laptop, wearable computer, and/or Personal Digital Assistant (PDA), mobile terminal, Bluetooth device, communicator, "smart" phone (such as a Treo-like device), messaging service (e.g., Blackberry) receiver, pager, facsimile, cellular telephone, a traditional telephone, telephonic device, a programmed microprocessor or microcontroller and/or peripheral integrated circuit elements, an ASIC or other integrated circuit, a hardware electronic logic circuit such as a discrete element circuit, and/or a programmable logic device such as a PLD, PLA, FPGA, or PAL, or the like, etc. In general any device on which resides a finite state machine capable of implementing at least a portion of a method, structure, and/or or graphical user interface described herein may be used as an information device. An information device can comprise components such as one or more network interfaces, one or more processors, one or more memories containing instructions, and/or one or more input/output (I/O) devices, one or more user interfaces coupled to an I/O device, etc.

initialize—to prepare something for use and/or some future event.

input/output (I/O) device—any sensory-oriented input and/or output device, such as an audio, visual, haptic, olfactory, and/or taste-oriented device, including, for example, a monitor, display, projector, overhead display, keyboard, keypad, mouse, trackball, joystick, gamepad, wheel, touchpad, touch panel, pointing device, microphone, speaker, video camera, camera, scanner, printer, haptic device, vibrator, tactile simulator, and/or tactile pad, potentially including a port to which an I/O device can be attached or connected.

local oscillator—a circuit associated with reciprocal networks that produces an alternating output current of a certain frequency determined by characteristics of components of the circuit.

machine instructions—directions adapted to cause a machine, such as an information device, to perform one or more particular activities, operations, or functions. The directions, which can sometimes form an entity called a "processor", "kernel", "operating system", "program", "application", "utility", "subroutine", "script", "macro", "file", "project", "module", "library", "class", and/or "object", etc., can be embodied as machine code, source code, object code, compiled code, assembled code, interpretable code, and/or executable code, etc., in hardware, firmware, and/or software.

machine readable medium—a physical structure from which a machine can obtain data and/or information. Examples include a memory, punch cards, etc.

material property—a quantitative characteristic of a substance comprised by an electrical circuit.

may—is allowed and/or permitted to, in at least some embodiments.

measure—to sense and/or detect a magnitude of something.

memory device—an apparatus capable of storing analog or digital information, such as instructions and/or data. Examples include a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory device can be coupled to a processor and/or can store instructions adapted to be executed by processor, such as according to an embodiment disclosed herein.

method—a process, procedure, and/or collection of related activities for accomplishing something.

mismatched—having a different impedance and reflecting signals relative to another transmission line.

permittivity—an ability of a substance to store electrical energy in an electric field.

phase—an initial angle of a sinusoidal function at its origin.

phase drift—an offset of an oscillator from its nominal phase.

physical property—a determinable value that describes a state of one or more components of an electrical circuit.

plurality—the state of being plural and/or more than one.

predetermined—established in advance.

process—to transform and/or transfer information comprised by a signal. Processing devices, systems, and/or methods can utilize one or more of amplification, smoothing, transformation, mathematical, statistical, computational, heuristic, linguistic representations, formalisms, and techniques for representation, modeling, analysis, synthesis, discovery, recovery, sensing, acquisition, extraction, learning, security, and/or forensics, etc.

processor—a device and/or set of machine-readable instructions for performing one or more predetermined tasks. A processor can comprise any one or a combination of hardware, firmware, and/or software. A processor can utilize mechanical, pneumatic, hydraulic, electrical, magnetic, optical, informational, chemical, and/or biological principles, signals, and/or inputs to perform the task(s). In certain embodiments, a processor can act upon information by manipulating, analyzing, modifying, converting, transmitting the information for use by an executable procedure and/or an information device, and/or routing the information to an output device. A processor can function as a central processing unit, local controller, remote controller, parallel controller, and/or distributed controller, etc. Unless stated otherwise, the processor can be a general-purpose device, such as a microcontroller and/or a microprocessor, such the Pentium IV series of microprocessor manufactured by the Intel Corporation of Santa Clara, Calif. In certain embodiments, the processor can be dedicated purpose device, such as an Application Specific Integrated Circuit (ASIC) or a Field Programmable Gate Array (FPGA) that has been designed to implement in its hardware and/or firmware at least a part of an embodiment disclosed herein.

project—to calculate, estimate, or predict.

propagation constant—a measure of the change undergone by the amplitude and phase of the wave as it propagates in a given direction. The quantity being measured can be the voltage or current in a circuit or a field vector such as electric field strength or flux density. The propagation constant itself measures change per unit length but is otherwise dimensionless. In the context of two-port networks and their cascades, propagation constant measures the change undergone by the source quantity as it propagates from one port to the next.

provide—to furnish, supply, give, and/or make available.

radical argument—a mathematical root.

receive—to get as a signal, take, acquire, and/or obtain.

receiver—a device and/or system that that acquires a signal from a signal transmitter.

reciprocal network—a two-port network in which a voltage appearing at port 2 due to a current applied at port 1 is the same as the voltage appearing at port 1 when the same current is applied to port 2.

recommend—to suggest, praise, commend, and/or endorse.

relative permeability—a measure of an ability of a material to support formation of a magnetic field within itself.

remove—to take away.

render—to make perceptible to a human, for example as data, commands, text, graphics, audio, video, animation, and/or hyperlinks, etc., such as via any visual, audio, and/or haptic means, such as via a display, monitor, electric paper, ocular implant, cochlear implant, speaker, etc.

repeatedly—again and again; repetitively.

request—to express a desire for and/or ask for.

sample—to make a measurement over a predetermined time interval.

section—a distinct part of something.

select—to make a choice or selection from alternatives.

set—a related plurality.

signal—information, such as machine instructions for activities and/or one or more letters, words, characters, symbols, signal flags, visual displays, and/or special sounds, etc. having prearranged meaning, encoded as automatically detectable variations in a physical variable, such as a pneumatic, hydraulic, acoustic, fluidic, mechanical, electrical, magnetic, optical, chemical, and/or biological variable, such as power, energy, pressure, flowrate, viscosity, density, torque, impact, force, frequency, phase, voltage, current, resistance, magnetomotive force, magnetic field intensity, magnetic field flux, magnetic flux density, reluctance, permeability, index of refraction, optical wavelength, polarization, reflectance, transmittance, phase shift, concentration, and/or temperature, etc. Depending on the context, a signal and/or the information encoded therein can be synchronous, asynchronous, hard real-time, soft real-time, non-real time, continuously generated, continuously varying, analog, discretely generated, discretely varying, quantized, digital, broadcast, multicast, unicast, transmitted, conveyed, received, continuously measured, discretely measured, processed, encoded, encrypted, multiplexed, modulated, spread, de-spread, demodulated, detected, de-multiplexed, decrypted, and/or decoded, etc.

store—to place, hold, and/or retain data, typically in a memory.

substantially—to a great extent or degree.

switch error term—a corrective value that accounts for differences in an internal reflection performance of a vector network analyzer between a source mode and a receive mode.

system—a collection of mechanisms, devices, machines, articles of manufacture, processes, data, and/or instructions, the collection designed to perform one or more specific functions.

transmission line—any physical or man-made structure that can transmit electromagnetic waves. For example, in the case of quasi-optics a sample of material positioned in the optical path can be an embodiment of a transmission line.

transmissive device—an apparatus from which electrical signals emanate.

transmissive standard—a signal of substantially known properties that is sent to and/or received by a network.

transmit—to send as a signal, provide, furnish, and/or supply.

two-port scattering parameters—values that describe the electrical behavior of linear electrical networks between a pair of external coupling sites when undergoing various steady state stimuli by electrical signals.

two-port network—an electrical network or device with two pairs of terminals coupleable to external circuits.

Unknown Thru—sometimes known as short open load reciprocal ("SOLA") is a two-port method, which uses short/open/load on each port, then an unknown but reciprocal (S21=S12) thru standard between the ports. Some particularly useful applications are when both ends of the cable are the same sex (such as if a device under test has female SubMiniature version A connectors on each port), or an on wafer calibration where the thru line between the probes has a bend or maybe a loop back (for differential probes). In the case of a female-to-female device under test, after putting on the open short load standards, any kind of female-to-female adapter can be used, and the method will complete.

user interface—any device for rendering information to a user and/or requesting information from the user. A user interface includes at least one of textual, graphical, audio, video, animation, and/or haptic elements. A textual element can be provided, for example, by a printer, monitor, display, and/or projector, etc. A graphical element can be provided, for example, via a monitor, display, projector, and/or visual indication device, such as a light, flag, beacon, etc. An audio element can be provided, for example, via a speaker, microphone, and/or other sound generating and/or receiving device. A video element or animation element can be provided, for example, via a monitor, display, projector, and/or other visual device. A haptic element can be provided, for example, via a very low frequency speaker, vibrator, tactile stimulator, tactile pad, simulator, keyboard, keypad, mouse, trackball, joystick, gamepad, wheel, touchpad, touch panel, pointing device, and/or other haptic device, etc. A user interface can include one or more textual elements such as, for example, one or more letters, number, symbols, etc. A user interface can include one or more graphical elements such as, for example, an image, photograph, drawing, icon, window, title bar, panel, sheet, tab, drawer, matrix, table, form, calendar, outline view, frame, dialog box, static text, text box, list, pick list, pop-up list, pull-down list, menu, tool bar, dock, check box, radio button, hyperlink, browser, button, control, palette, preview panel, color wheel, dial, slider, scroll bar, cursor, status bar, stepper, and/or progress indicator, etc. A textual and/or graphical element can be used for selecting, programming, adjusting, changing, specifying, etc. an appearance, background color, background style, border style, border thickness, foreground color, font, font style, font size, alignment, line spacing, indent, maximum data length, validation, query, cursor type, pointer type, autosizing, position, and/or dimension, etc. A user interface can include one or more audio elements such as, for example, a volume control, pitch control, speed control, voice selector, and/or one or more elements for controlling audio play, speed, pause, fast forward, reverse, etc. A user interface can include one or more video elements such as, for example, elements controlling video play, speed, pause, fast forward, reverse, zoom-in, zoom-out, rotate, and/or tilt, etc. A user interface can include one or more animation elements such as, for example, elements controlling animation play, pause, fast forward, reverse, zoom-in, zoom-out, rotate, tilt, color, intensity, speed, frequency, appearance, etc. A user interface can include one or more haptic elements such as, for example, elements utilizing tactile stimulus, force, pressure, vibration, motion, displacement, temperature, etc.

vector network analyzer—an instrument that measures network parameters of electrical networks; the parameters can comprise both amplitude and phase properties.

vector network analyzer self-calibration algorithm—a method wherein an instrument that measures the network parameters of electrical networks adjusts measurements via a comparison of measurement values delivered by a system under test with those of a standard of known quantity and/or accuracy.

via—by way of and/or utilizing.

unwrap—to correct radian phase angles in a vector by adding multiples of ±2π when absolute jumps between consecutive elements of P are greater than or equal to the default jump tolerance of π radians.

waveguide—a device and/or system that confines and/or conveys microwaves.

weight—a value indicative of importance.

Note

Still other substantially and specifically practical and useful embodiments will become readily apparent to those skilled in this art from reading the above-recited and/or herein-included detailed description and/or drawings of certain exemplary embodiments. It should be understood that numerous variations, modifications, and additional embodiments are possible, and accordingly, all such variations, modifications, and embodiments are to be regarded as being within the scope of this application.

Thus, regardless of the content of any portion (e.g., title, field, background, summary, description, abstract, drawing figure, etc.) of this application, unless clearly specified to the contrary, such as via explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

no characteristic, function, activity, or element is "essential";

any elements can be integrated, segregated, and/or duplicated;

any activity can be repeated, any activity can be performed by multiple entities, and/or any activity can be performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

When any claim element is followed by a drawing element number, that drawing element number is exemplary and non-limiting on claim scope. No claim of this application is intended to invoke paragraph six of 35 USC 112 unless the precise phrase "means for" is followed by a gerund.

Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such material is specifically not incorporated by reference herein.

Accordingly, every portion (e.g., title, field, background, summary, description, abstract, drawing figure, etc.) of this application, other than the claims themselves, is to be regarded as illustrative in nature, and not as restrictive, and the scope of subject matter protected by any patent that issues based on this application is defined only by the claims of that patent.

What is claimed is:

1. A method comprising:
   determining a local oscillator phase drift occurring in between two measurements of reciprocal networks as made with a vector network analyzer via a calculation of an equation:

$$\theta = \frac{-\angle |A_m|^{-1}|B'_m|}{2}$$

where:
   $A_m$ is a wave cascading matrix that comprises results of a measurement from a first reciprocal network of the reciprocal networks; and
   $B_m$ is a wave cascading matrix that comprises results of a measurement from a second reciprocal network of the reciprocal networks; and
   $\angle$ represents a complex argument, and vertical brackets (||) represent matrix determinants.

2. The method of claim of 1, further comprising:
   automatically removing the local oscillator phase drift.

3. The method of claim of 1, further comprising:
   determining that the vector network analyzer substantially simultaneously samples all incident and reflected waves from the reciprocal networks.

4. The method of claim of 1, further comprising:
   determining switch error terms of the vector network analyzer.

5. The method of claim of 1, further comprising:
   applying switch error term correction to measurements.

6. The method of claim of 1, further comprising:
   measuring a response from each of the reciprocal networks with the vector network analyzer.

7. The method of claim of 1, wherein:
   the local oscillator phase drift is removed from one or more transmissive standards during a calibration of the vector network analyzer.

8. A method comprising:
detecting that a local oscillator phase drift of value larger than $\pm\pi/2$ radians has occurred, and choosing a correct branch of a complex argument of an equation:

$$\theta = \frac{-\angle |A_m|^{-1}|B'_m|}{2}$$

where:
$A_m$ is a wave cascading matrix that comprises results of a measurement from a first reciprocal network; and
$B_m$ is a wave cascading matrix that comprises results of a measurement from a second reciprocal network; and
$\angle$ represents a complex argument, and vertical brackets (||) represent matrix determinants; and
automatically correcting for the local oscillator phase drift.

9. The method of claim 8, further comprising:
sampling incident and reflected waves to detect branch jumps through changes in local oscillator phase drift over samples.

* * * * *